United States Patent [19]
Castro et al.

[11] Patent Number: 5,835,333
[45] Date of Patent: Nov. 10, 1998

[54] NEGATIVE OFFSET BIPOLAR ELECTROSTATIC CHUCKS

[75] Inventors: Edward Ross Castro, San Jose; Ken Edwin Tokunaga, Fremont; Boris V. Atlas, San Jose; David Ru-Chen Liu, Saratoga, all of Calif.

[73] Assignee: Lam Research Corporation, Fremont, Calif.

[21] Appl. No.: 550,510

[22] Filed: Oct. 30, 1995

[51] Int. Cl.[6] .................................................. H02N 13/00
[52] U.S. Cl. .......................... 361/234; 361/235; 279/128
[58] Field of Search .................................. 361/233–235; 279/128

[56] References Cited

U.S. PATENT DOCUMENTS

| | | | |
|---|---|---|---|
| 3,933,509 | 1/1976 | McGinty | 148/1.5 |
| 3,993,509 | 11/1976 | McGinty | 148/1.5 |
| 4,184,188 | 1/1980 | Briglia | 361/234 |
| 4,384,918 | 5/1983 | Abe | 156/643 |
| 4,431,473 | 2/1984 | Okano et al. | 156/345 |
| 4,464,223 | 8/1984 | Gorin | 156/643 |
| 4,502,094 | 2/1985 | Lewin et al. | 361/234 |
| 4,554,611 | 11/1985 | Lewin | 361/234 |
| 4,579,618 | 4/1986 | Celestino et al. | 156/345 |
| 4,645,218 | 2/1987 | Ooshio et al. | 279/1 M |
| 4,665,463 | 5/1987 | Ward et al. | 361/234 |
| 4,692,836 | 9/1987 | Suzuki | 361/234 |
| 4,724,510 | 2/1988 | Wicker et al. | 361/234 |

(List continued on next page.)

FOREIGN PATENT DOCUMENTS

| | | | |
|---|---|---|---|
| 0 439 000 B1 | 9/1994 | European Pat. Off. | H02N 13/00 |
| 62-157752 | 7/1987 | Japan | B23Q 3/15 |
| 1-251735 | 10/1989 | Japan . | |
| 3-3249 | 1/1991 | Japan | H01L 21/68 |
| 3-147843 | 6/1991 | Japan | B32B 18/00 |
| 3-147844 | 6/1991 | Japan | B32B 18/00 |
| 1443215 | 7/1976 | United Kingdom | H02N 13/00 |
| 1443215 | 7/1996 | United Kingdom | H02N 13/00 |

OTHER PUBLICATIONS

Unknown, "Patent Abstracts of Japan," vol. 095, No. 002, & JP 06 326176A, Tokyo Electron, Ltd., Nov. 25, 1994 (Publication date).

Unknown, "Patent Abstracts of Japan," vol. 18, No. 599 (E–1631), & JP 06 232089A, Tokyo Electron, Ltd., Aug. 19, 1994 (Publication Date).

Yunji Ra and Ching–Hwa Chen, "*Direct current bias as an ion current monitor in the transformer coupled plasma etcher*", vol. 11, No. 6, Nov. 1, 1993, pp. 2911–2913, Journal of Vacuum Science and Technology, Woodbury, NY.

Watanabe, Toshiya, et al., Relationship between Electrical Resistivity and Electrostatic Force and Alumina Electrostatic Chuck, Feb. 1993, Jpn. J. Appl. Phys. vol. 32, pp. 864–871, Part 1, No. 2.

Watanabe, T., et al., Electrostatic charge distribution in the dielectric layer of alumina electrostatic chuck, 1994, Journal of Materials Science 29, pp. 3510–3516.

(List continued on next page.)

*Primary Examiner*—Fritz Fleming
*Attorney, Agent, or Firm*—Beyer & Weaver, LLP

[57] ABSTRACT

A bipolar electrostatic chuck system having a bipolar electrostatic chuck for securely holding a wafer on the surface of the bipolar electrostatic chuck. The bipolar electrostatic chuck system includes a negative-offset power supply for providing a positive potential level and a negative potential level. The positive potential level is positively biased relative to a common reference voltage level by a first magnitude while the negative potential level is negatively biased relative to the same common reference voltage level by a second magnitude, which is larger than the first magnitude. Further, the bipolar electrostatic chuck includes a positive pole, which is coupled to the negative-offset power supply for biasing the positive pole at the positive potential level when the negative-offset power supply is turned on. Additionally, the bipolar electrostatic chuck includes a negative pole, which is coupled to the negative-offset power supply for biasing the negative pole at the negative potential level when the negative-offset power supply is turned on.

11 Claims, 8 Drawing Sheets

U.S. PATENT DOCUMENTS

| | | | |
|---|---|---|---|
| 4,842,683 | 6/1989 | Cheng et al. | 156/345 |
| 4,897,171 | 1/1990 | Ohmi | 204/298 |
| 4,962,441 | 10/1990 | Collins | 361/234 |
| 4,983,254 | 1/1991 | Fujimura et al. | 156/643 |
| 5,055,964 | 10/1991 | Logan et al. | 361/234 |
| 5,103,367 | 4/1992 | Horwitz et al. | 361/234 |
| 5,104,834 | 4/1992 | Watanabe et al. | 501/127 |
| 5,110,438 | 5/1992 | Ohmi et al. | 204/298.34 |
| 5,117,121 | 5/1992 | Watanabe et al. | 307/130 |
| 5,151,845 | 9/1992 | Watanabe et al. | 361/234 |
| 5,160,152 | 11/1992 | Toraguchi et al. | 279/128 |
| 5,179,498 | 1/1993 | Hongoh et al. | 361/234 |
| 5,191,506 | 3/1993 | Logan et al. | 361/234 |
| 5,325,261 | 6/1994 | Horwitz | 361/234 |
| 5,326,725 | 7/1994 | Sherstinksy et al. | 437/225 |
| 5,350,479 | 9/1994 | Collins et al. | 156/345 |
| 5,459,632 | 10/1995 | Birang et al. | 361/234 |
| 5,463,525 | 10/1995 | Barnes et al. | 361/234 |
| 5,467,249 | 11/1995 | Barnes et al. | 361/234 |
| 5,535,507 | 7/1996 | Barnes et al. | 361/234 |
| 5,557,215 | 9/1996 | Saeki et al. | 324/765 |
| 5,561,585 | 10/1996 | Barnes et al. | 361/234 |

OTHER PUBLICATIONS

Field, John, Wafer Handling, Electrostatic wafer clamping for next–generation manufacturing, Sep., 1994, Solid State Technology.

Daviel, J.F., et al., Electrostatic Clamping Applied to Semiconductor Plasma Processing, I. Theoretical Modeling, Nov. 1993,J. Electrochem. Soc., No. 11.

Wright, D.R., et al., Manufacturing issues of electrostatic chucks, Jul./Aug. 1995, J. Vac. Sci. Technol. B.

Daviel, J.F., et al., Electrostatic Clamping Applied to Semicondutor Plasma Processing II. Experimental Results, J. Electrochem., Soc., vol. 140, No. 11, Nov. 1993.

NEGATIVE OFFSET BIPOLAR ELECTROSTATIC CHUCKS

BACKGROUND OF THE INVENTION

The present invention relates to the manufacture of semiconductor devices. More specifically, the present invention relates to methods and apparatuses for clamping a semiconductor wafer on a chuck in a plasma processing chamber.

Plasma-enhanced semiconductor processes for etching, oxidation, annodization, chemical vapor deposition (CVD), or the like are known. For illustration purposes, FIG. 1 shows a representative plasma processing system 100 having a plasma processing chamber 102. Within chamber 102, shower head 104 preferably includes a plurality of holes for releasing gaseous source materials (typically around the periphery edge of shower head 104) into the RF-induced plasma region between itself and a wafer 108. In one embodiment, shower head 104 is made of quartz although it may also be made of other suitable materials and may be left either electrically floating or grounded. Wafer 108 is disposed on a chuck 110, which acts as a second electrode and is preferably biased by a radio frequency generator 120 via a matching network 122. To provide a path to ground, the chamber wall of chamber 102 is typically grounded.

To ensure uniform and repeatable etching and deposition of materials, it is required that the temperature of wafer 108 be highly controlled during plasma processing. Control of the wafer temperature is typically accomplished by introducing a heat-exchange gas, typically one of the noble gases such as helium, underneath the wafer into the wafer/chuck interface. In the plasma processing system of FIG. 1, for example, helium is introduced via port 112 into the region between wafer 108 and chuck 110. Although helium is mentioned herein as the preferred heat-exchange gas, it should be understood that another suitable heat-exchange gas may well be employed.

To provide an adequate heat transfer medium between the wafer and the chuck, a helium pressure of 5–15 Torr is typically required. Since the ambient pressure within chamber 102 is relatively low, typically around 5 milliTorr–100 milliTorr (mT), a clamping mechanism is usually necessary to secure wafer 108 on chuck 110. Clamping also minimizes the helium leakage around the underside of the wafer to maintain an acceptable helium pressure and achieve satisfactory heat transfer.

To implement the aforementioned clamping mechanism, FIG. 1 illustrates a prior art mechanical wafer clamping scheme that employs topside mechanical clamps 114. Although topside mechanical clamps accomplish the desired goal of securing wafer 108 on chuck 110 when helium gas is introduced into the wafer/chuck interface, there are significant disadvantages associated with their use. For example, when a mechanical clamp is used on a wafer, the portion of that wafer under the mechanical clamp is unavailable for semiconductor devices fabrication. Moreover, the presence of a mechanical clamp on the wafer top surface potentially introduces edge, shadow, or particle effects, which result in nonuniformity and particle inconsistencies in the wafer regions adjacent to the clamps. Since silicon wafers are expensive and manufacturers are always looking for ways to improve chip yield, alternatives to mechanical clamping have been sought.

Electrostatic clamping represents one such alternative. In electrostatic clamping, an electrostatic chuck is electrically biased relative to the wafer to generate electrostatic forces between the chuck and the wafer. The electrostatic forces then hold the wafer to the chuck, thereby eliminating the need for mechanical clamping.

FIG. 2 illustrates a simple monopolar electrostatic chuck 200, which is separated from wafer 108 by a layer of dielectric material 202. Dielectric layer 202 is typically provided with chuck 200 as a single unit. A heat-exchange gas such as helium is introduced into the region between wafer 108 and dielectric layer 202. Chuck 200 is energized by RF supply 203, typically through a capacitor circuit 205 to isolate the DC component of chuck 200 from the RF component of RF supply 203.

When the plasma is turned on in chamber 102, wafer 108 becomes negatively charged by the plasma. By turning on power supply 201 to bias chuck 200 positively with respect to the negatively charged wafer 108, a capacitor circuit is created with wafer 108 and chuck 200 acting as the two capacitor plates. There is typically provided an inductive filter circuit in series between power supply 201 and chuck 200 to isolate the RF component of chuck 200 from the DC component of power supply 201. In between these two plates, electrostatic force is created to securely clamp wafer 108 onto chuck 200. The electrostatic chuck of FIG. 2 is called a monopolar chuck since it is biased at a single polarity, i.e., positive, during use.

Note that since wafer 108 is not negatively charged until the plasma is turned on in chamber 102, there is effectively no clamping force on wafer 108 until plasma processing begins. Consequently, it is not possible to detect, e.g., by monitoring the rate of helium flow into the wafer/chuck interface, whether the clamping force between wafer 108 and chuck 200 is satisfactory. If there are contaminants, e.g., dust or the like, between wafer 108 and dielectric layer 202 that affect the clamping force, the problem cannot be rectified prior to the time the plasma is turned on. By the time the problem is detected, the affected wafer is usually already lost due to, for example, uneven heat transfer.

Further, wafer declamping is difficult with monopolar chuck systems. This is because even if power supply 201 and the plasma in chamber 102 are turned off, electrical charges are still retained in dielectric layer 202. The continued presence of these electrical charges maintain the electrostatic forces between wafer 108 and chuck 200, which act to resist wafer declamping efforts.

FIG. 3A illustrates a prior art bipolar electrostatic chuck that is capable of clamping wafer 108 to bipolar electrostatic chuck 302 even in the absence of plasma. As the name implies, bipolar electrostatic chuck 302 has two poles: a positive pole 304 and a negative pole 306. Positive pole 304 is positively biased, typically but not necessarily through an inductive filter circuit L1, by a power supply 310 relative to the common reference potential level. The common reference potential level represents the common potential of the plasma generating system and may represent, in one embodiment, ground. Negative-offset power supply 310 also biases, typically but not necessarily through an inductive filter circuit L2, negative pole 306 negatively relative to the common reference potential level by the same specified potential difference. Both positive pole 304 and negative pole 306 are excited by RF source 303, preferably through capacitor circuits C1 and C2.

Above the poles of the bipolar electrostatic chuck, there is disposed a dielectric layer 202, which may be made of any suitable dielectric material such as ceramic, polymer, or the like. Wafer 108 is then placed on top of this dielectric layer 202. When power supply 310 is turned on, the presence of a positive potential on positive pole 304 electrostatically induces the electrons in wafer 108 to move toward the wafer region overlaying positive pole 304. Conversely, positive charges or holes in wafer 108 migrate toward the wafer region overlaying negative pole 306. As a result, two capacitor circuits 320 and 322 are formed.

FIG. 3B illustrates the equivalent circuit formed by wafer 108, dielectric layer 202, positive pole 304, negative pole 306, and power supply 310 of FIG. 3A. In FIG. 3B, the plasma is not turned on and the wafer potential is at the potential of the common reference voltage level. Nevertheless, the electrostatic forces between the "plates" of capacitor circuits 320 and 322, i.e., between the poles and their respective overlaying wafer regions, provide the clamping forces required to keep wafer 108 clamped to bipolar electrostatic chuck 302.

To further discuss the prior art bipolar electrostatic chuck, assume that power supply 310 biases positive pole 304 at +350 V and negative pole 306 at −350 V relative to the common reference voltage level in the equivalent circuit of FIGS. 3B and 3C. With the plasma off, the wafer potential is at 0 V relative to the common reference voltage level, and the potential differences across the plates of capacitor circuits 320 and 322 are +350 V and −350 V respectively.

When wafer 108 is negatively charged due to the presence of plasma, however, the potential differences between the wafer and the two poles of the bipolar electrostatic chuck become asymmetric. To illustrate, consider the example of FIG. 3C. Assume that the wafer bias voltage is −100 V when the plasma is turned on. In this case, the potential difference across the plates of capacitor circuit 320 over the positive pole is increased to +450 V, i.e., (+350 V−(−100 V)). However, the potential difference across the plates of capacitor circuit 322 over the negative pole is decreased to only −250 V, i.e., (−350 V−(−100 V)).

The imbalance in the potential differences over the two poles result in an asymmetric distribution of electrostatic forces on wafer 108. In some cases, this difference results in the inadequate clamping of the wafer to the negative pole of the bipolar electrostatic chuck. When this happens, wafer warpage, inadequate wafer temperature control or unacceptable helium loss may follow.

In view of the foregoing, what is desired is improved methods and apparatus for a bipolar electrostatic chuck that satisfactorily and efficiently clamps a wafer onto its surface while plasma is present in the plasma processing chamber.

SUMMARY OF THE INVENTION

The invention relates, in one embodiment, to a bipolar electrostatic chuck system having a bipolar electrostatic chuck for securely holding a wafer on the surface of the bipolar electrostatic chuck. The bipolar electrostatic chuck system includes a negative-offset power supply for providing a positive potential level and a negative potential level. The positive potential level is positively biased relative to a common reference voltage level by a first magnitude while the negative potential level is negatively biased relative to the common reference voltage level by a second magnitude, which is larger than the first magnitude.

Further, the bipolar electrostatic chuck includes a positive pole, which is coupled to the negative-offset power supply for biasing the positive pole at the positive potential level when the negative-offset power supply is turned on. Additionally, the bipolar electrostatic chuck includes a negative pole, which is coupled to the negative-offset power supply for biasing the negative pole at the negative potential level when the negative-offset power supply is turned on.

In another aspect, the invention relates to a method in a plasma processing chamber having a bipolar electrostatic chuck, the bipolar electrostatic chuck having a first pole, a second pole, and a dielectric layer disposed on both of the first and second poles, for securely holding a wafer on the surface of the dielectric layer. The method includes the step of providing a positive potential level to the first pole of the bipolar electrostatic chuck. The positive potential level is positively biased relative to a common reference voltage level of the plasma processing chamber by a first magnitude.

The method further includes the step of providing a negative potential level to the second pole of the bipolar electrostatic chuck. The negative potential level is negatively biased relative to the common reference voltage level by a second magnitude that is larger than the first magnitude.

In yet another embodiment, the second magnitude differs from the first magnitude by approximately the magnitude of the bias voltage level of the wafer during plasma processing.

BRIEF DESCRIPTION OF THE DRAWINGS

Additional advantages of the invention will become apparent upon reading the following detailed description and drawings.

DETAILED DESCRIPTION OF THE INVENTION

Figure 1:
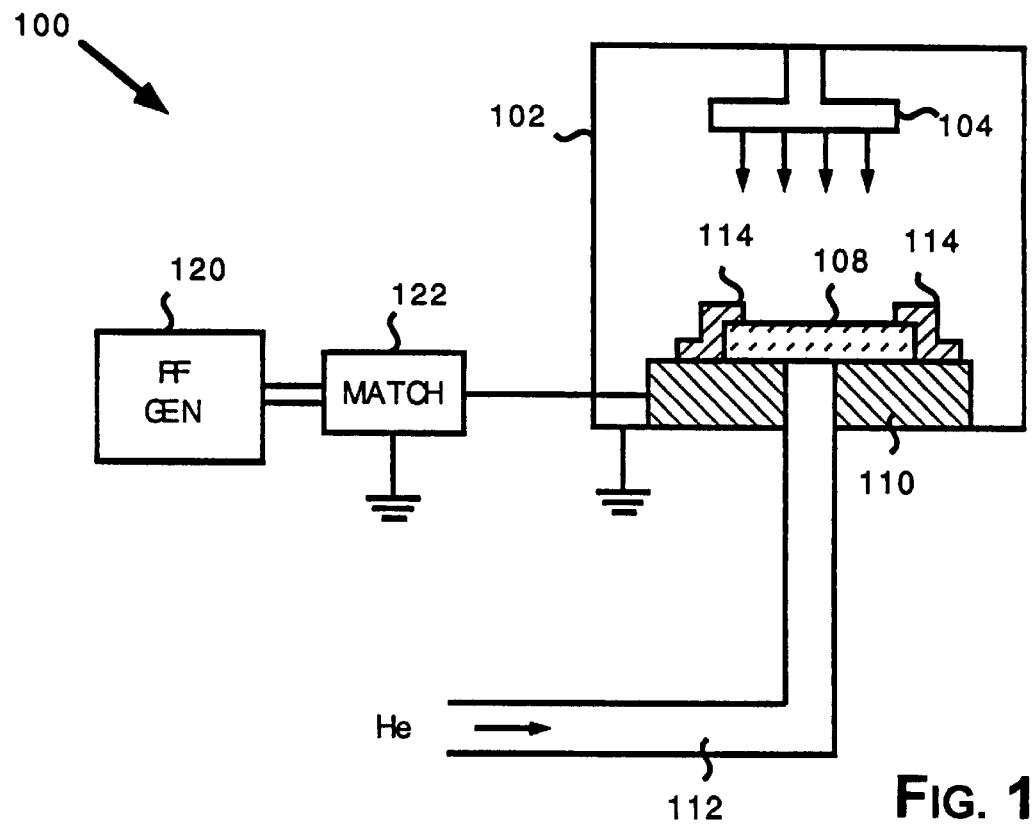
FIG. 1 illustrates a representative plasma processing system, including the mechanical clamps for clamping a wafer to its chuck.

FIG. 1 illustrates a representative plasma processing system, including mechanical clamps for clamping a wafer to its chuck.

Figure 2:
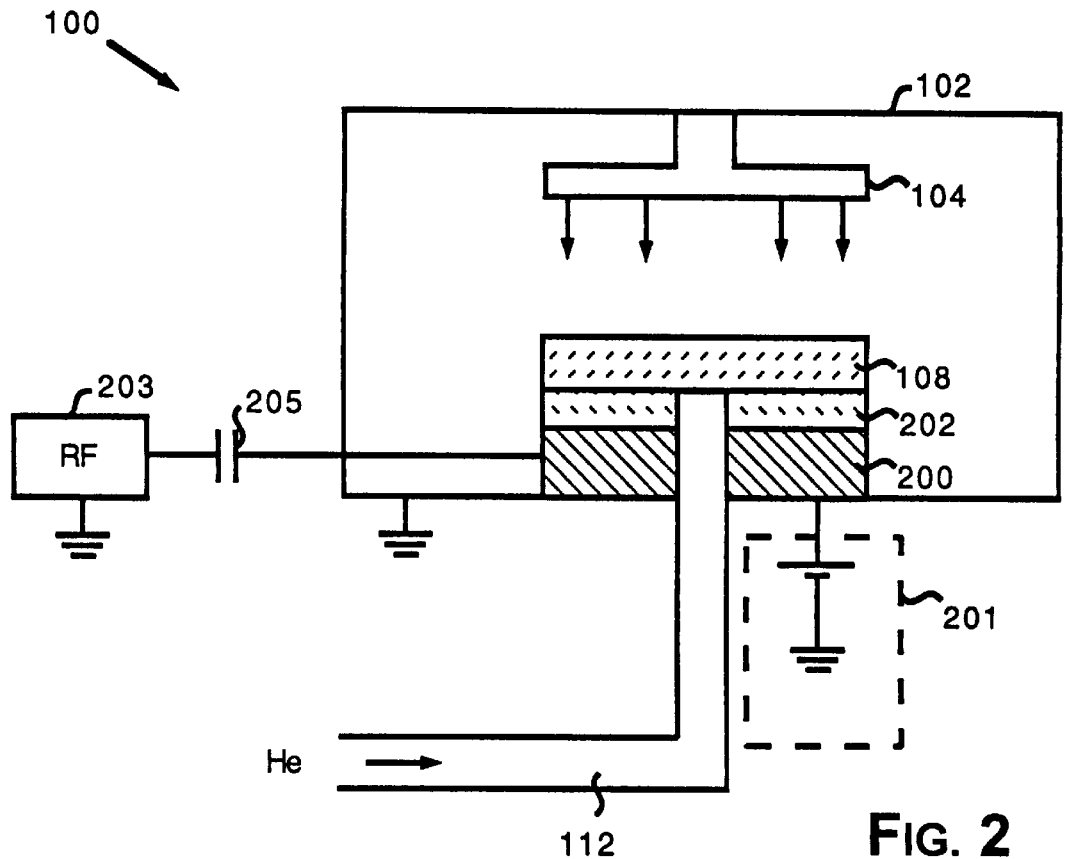
FIG. 2 illustrates a simple monopolar electrostatic chuck.

FIG. 2 illustrates a simple monopolar electrostatic chuck.

Figure 3A:
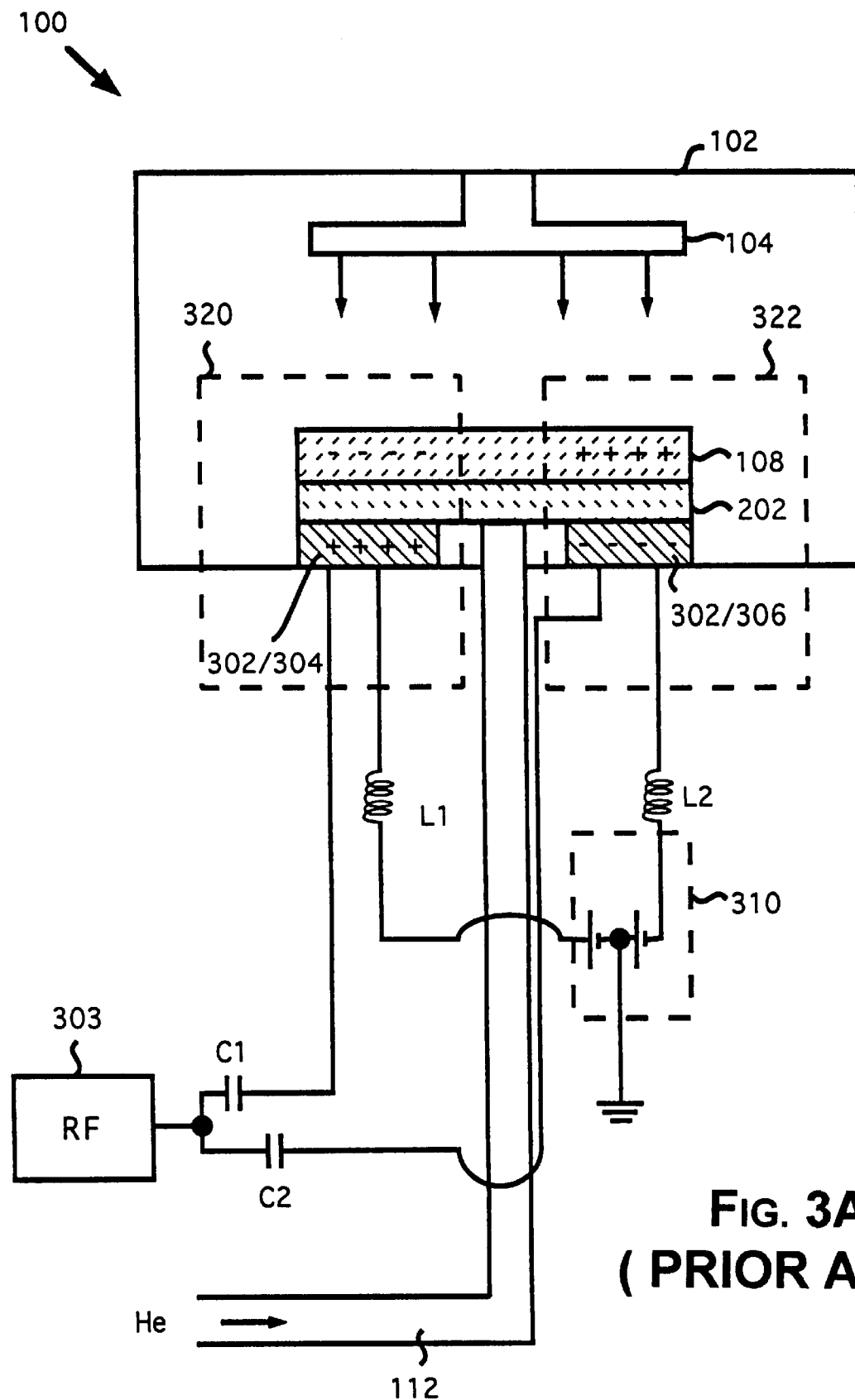
FIGS. 3A–3C illustrate a prior art bipolar electrostatic chuck and its equivalent circuit models.
Figure 3B:
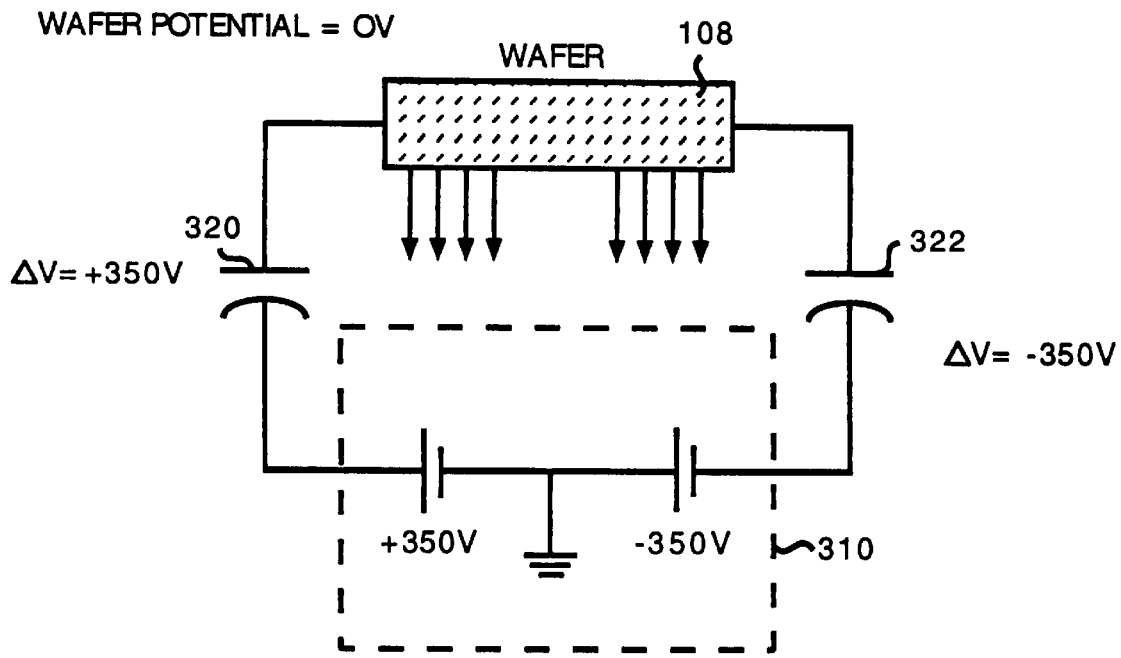
Figure 3C:
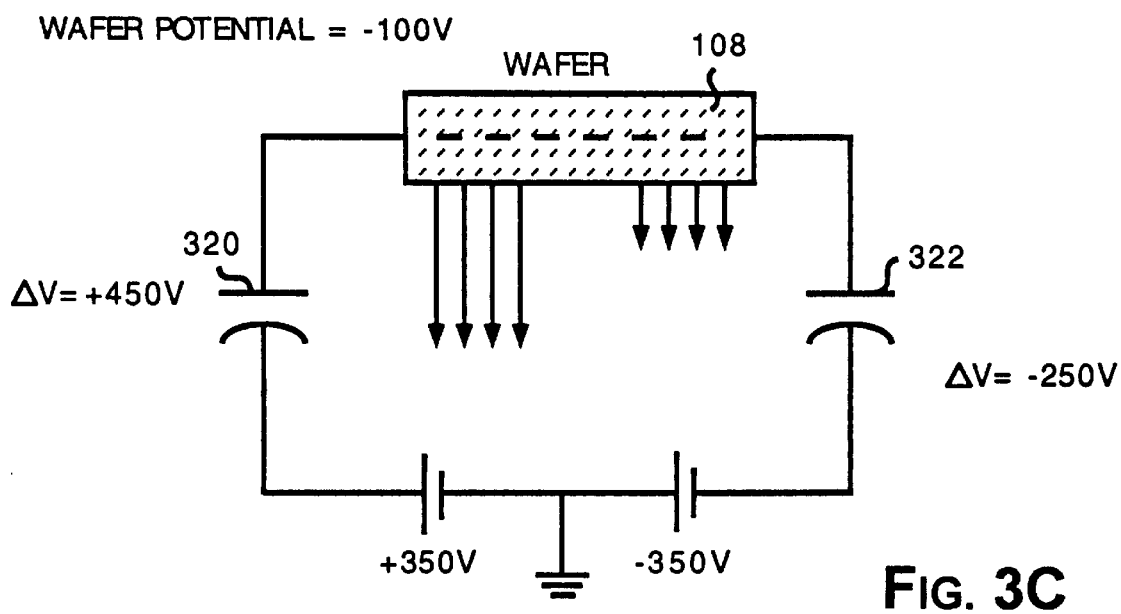

FIGS. 3A–3C illustrate a prior art bipolar electrostatic chuck and its equivalent circuit models.

Figure 4:
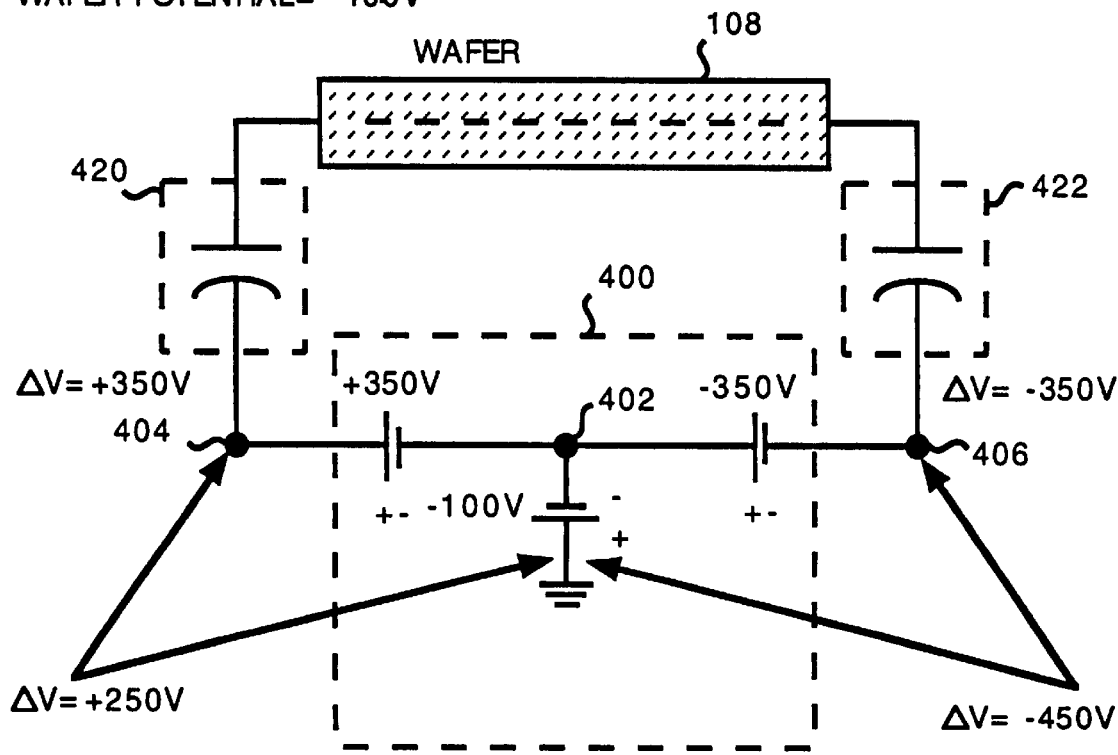
FIG. 4 illustrates, in one embodiment of the present invention, an equivalent circuit of a negative-offset bipolar electrostatic chuck.

To facilitate discussion FIG. 4 illustrates, in one embodiment of the present invention, an equivalent circuit of a negative-offset bipolar electrostatic chuck system that advantageously keeps the electrostatic forces over the positive and negative poles of the electrostatic chuck substantially in balance during plasma processing. At offset node 402, a power supply 400 is biased by a negative offset potential. In the example of FIG. 4, this negative offset potential is –100 V relative to the common reference voltage level. Positive pole 404 is biased at a positive potential relative to offset node 402 by a predefined magnitude while negative pole 406 is biased by the same magnitude relative to offset node 402 but in the negative direction. In this example, positive pole 404 is at +350V relative to offset node 402 while negative pole 406 is at –350V relative to offset node 402.

When power supply 400 is turned on, wafer 108 and the two poles 404 and 406 essentially create two capacitor circuits 420 and 422. If wafer 108 is not negatively biased by the plasma, the potential difference across the plates of capacitor circuit 420, representing the positive pole and the associated overlaying wafer region, is 250 V (350V–100V). The potential difference across the plates of capacitor circuit 422, representing the negative pole and the associated overlaying wafer region, is –450 V (–100 V+(–350V)).

When the plasma is present in the processing chamber and wafer 108 becomes negatively charged, the imbalance in the electrostatic forces over to the positive and negative poles of FIG. 4 is rectified. If, for example, wafer 108 is negatively biased by the same magnitude as the offset voltage at offset node 402, i.e., –100 V in the present example, the potential differences between the plates of capacitor circuits 420 and 422 are at +350V and –350V respectively. As such, the electrostatic forces holding the wafer to the chuck are balanced over the two poles, resulting in improved physical contact between the wafer and the chuck as well as a tighter seal for the helium gas.

Figure 5A:
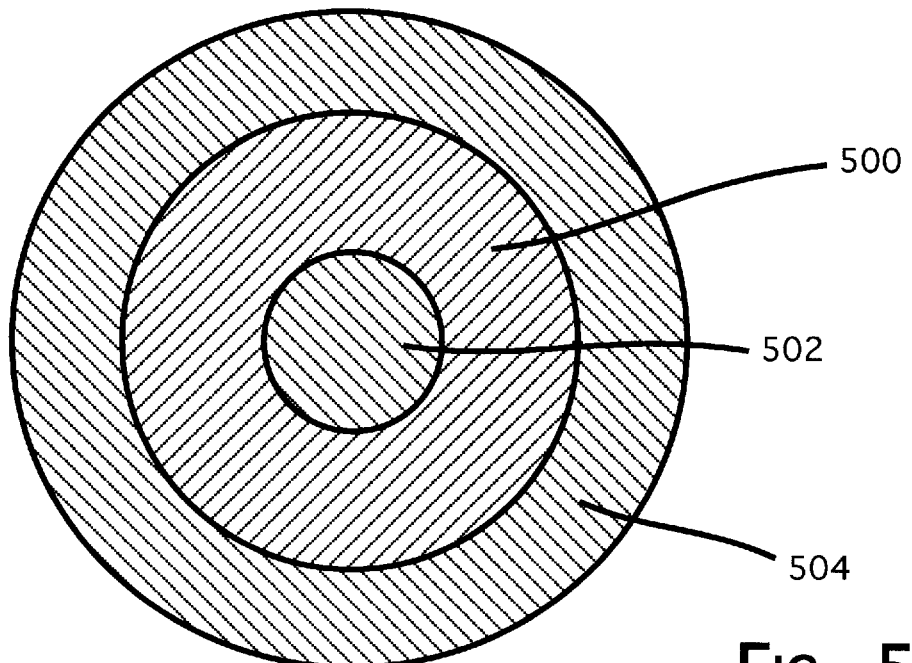
FIG. 5A illustrates the physical configuration of one preferred embodiment of the inventive negative-offset bipolar electrostatic chuck.

FIG. 5A illustrates the physical configuration of one preferred embodiment of the negative-offset bipolar electrostatic chuck. A torroid region 500, preferably made of an aluminum alloy, is centered and set within a circular base, also preferably made of an aluminum alloy, dividing the top surface of the circular base into two base regions 502 and 504. When viewed from the top surface of the chuck, base region 502 is at the chuck center and separated from concentric base region 504 by torroid region 500. To maintain their different polarities, torroid region 500 is electrically isolated from base regions 502 and 504. Note that although the chuck of the present example is made of aluminum alloy, any other suitable conducting material may well be employed.

Figure 5B:
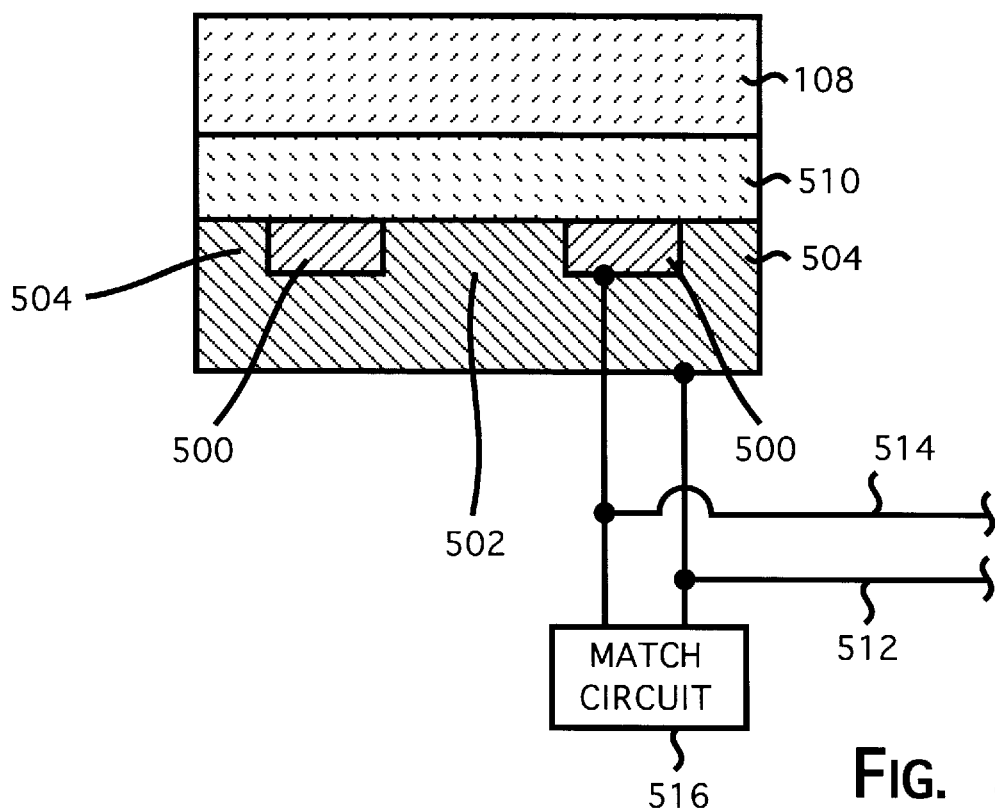
FIG. 5B is a cutaway drawing of the negative-offset bipolar electrostatic chuck of FIG. 5A.

FIG. 5B is a cutaway drawing of the negative-offset bipolar electrostatic chuck of FIG. 5A, including dielectric layer 510 and wafer 108. Potential levels that are negatively offset from the common reference voltage level and of opposite polarities are supplied to torroid region 500 and base regions 502 and 504 via conductors 512 and 514 respectively during operation. A conventional RF matching circuit 516 may be coupled to conductors 512 and 514 to maximize power delivery by the bipolar electrostatic chuck power supplies. In the preferred embodiment, torroid region 500 is preferably biased negatively although it may well represent the positive pole if appropriate for a particular process. Base regions 502 and 504 are then biased oppositely with respect to torroid region 500.

It should be borne in mind that the physical configuration of FIGS. 5A–5B is only illustrative and variations in the design of bipolar electrostatic chucks exist for different wafer types and wafer sizes. It is therefore intended that the negative-offset bipolar electrostatic chuck of the present invention may utilize any two-pole chuck irrespective of its physical configuration. By offsetting in the negative direction the potential levels of both the positive and negative poles, the electrostatic forces over the two poles are more evenly matched when the wafer becomes negatively charged by the plasma.

Figure 6:
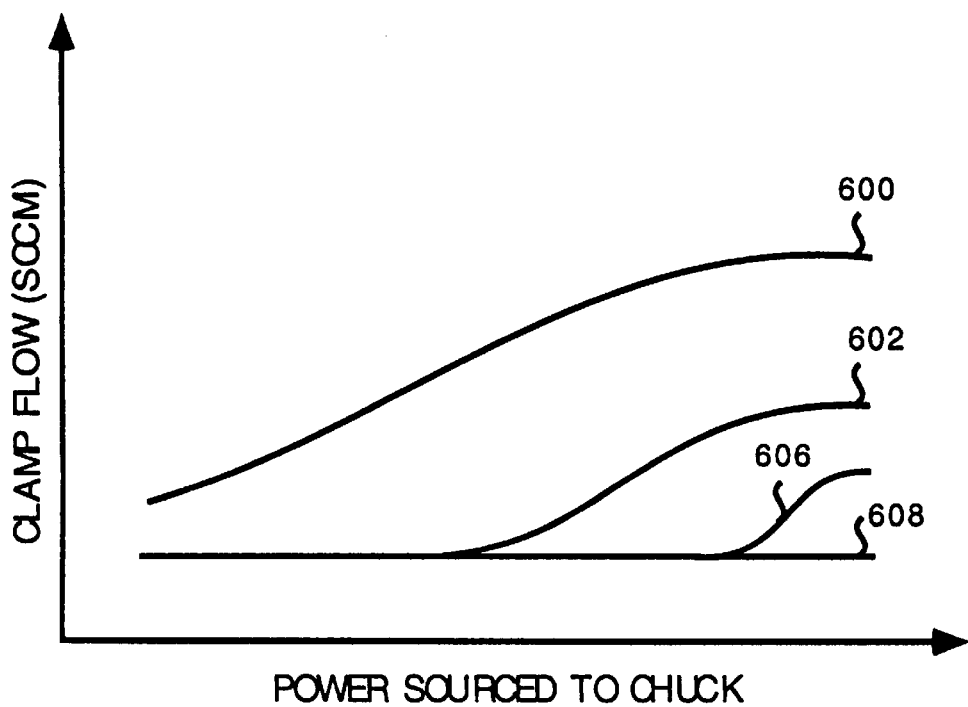
FIG. 6 is a graph illustrating the effect of the offset voltage on the flow of helium for one embodiment of the negative-offset bipolar electrostatic chuck of the present invention.

FIG. 6 is a graph illustrating the effect of the offset voltage on the flow of helium for one embodiment of the present invention. On the graph, the helium flow is shown on the vertical axis while the horizontal axis represents the amount of power sourced to the bipolar electrostatic chuck. The various lines on the graph represent the leak rate of helium for different settings of the offset voltage of the bipolar electrostatic chuck power supply.

Line 600, representing a positive offset voltage of +50 V, shows that the helium leak rate readily increases when the bipolar electrostatic chuck power is increased. This is surprising since one would expect an improvement in the clamping power for the negatively charged wafer when the positive pole is made more positive by a positive offset voltage. As line 600 shows, however, the imbalance in the electrostatic forces between the negatively charged wafer and the two poles results in increased helium leakage, evidencing a decrease in clamping performance.

Line 602 represents the helium leakage rate for the bipolar electrostatic chuck in which the offset voltage is coupled to ground, i.e., the positive pole and the negative pole are equally biased relative to the common reference voltage level. Helium leakage is lower for line 602 in comparison with line 600.

Line 606 represents the helium leakage rate for a bipolar electrostatic chuck which has its pole potentials negatively offset by –50 V. Compared to lines 600 and 602, this negatively offset bipolar electrostatic chuck does not start leaking a significant quantity of helium until the bipolar electrostatic chuck power supply is at a relatively high setting. When the magnitude of the negative offset voltage of the bipolar power supply is increased to –87 V (the corresponding helium leakage rate is represented by line 608 in FIG. 6), there is essentially no increase in the amount of helium leakage in the power range that can be shown in the graph. If the wafer bias is highly negative, it is contemplated that an even larger negative bipolar electrostatic chuck offset voltage may be employed to minimize helium leakage. For the minimum rate of helium leakage, it is preferable, but not necessary, that magnitude of the negative offset voltage of the bipolar electrostatic chuck power supply equals or is lower than the magnitude of the wafer potential during plasma processing.

As shown by the graph of FIG. 6, the presence of a negative offset voltage advantageously keeps the helium leakage rate low over a wide range of bipolar electrostatic chuck power, allowing the plasma processing equipment that employs the inventive negative-offset bipolar electrostatic chuck to be used with a wider range processes at different chuck bias levels.

In accordance with another aspect of the present invention, the outer periphery of the negative-offset bipolar electrostatic chuck, e.g., its vertical wall and/or any other chuck surface exposed to the ambient chamber environment, is preferably negatively biased to reduce current leakage from the chuck during plasma processing. This leakage current occurs through the plasma when charged particles in the plasma come into contact with the chuck to allow current to be leaked from the chuck to ground.

In prior art monopolar electrostatic chuck systems, the chuck is always positively biased to generate electrostatic forces with the negatively biased wafer. When so biased, negatively charged particles such as electrons from the plasma processing chamber is attracted to the positive chuck, creating a current path through the plasma to ground.

Figure 7A:
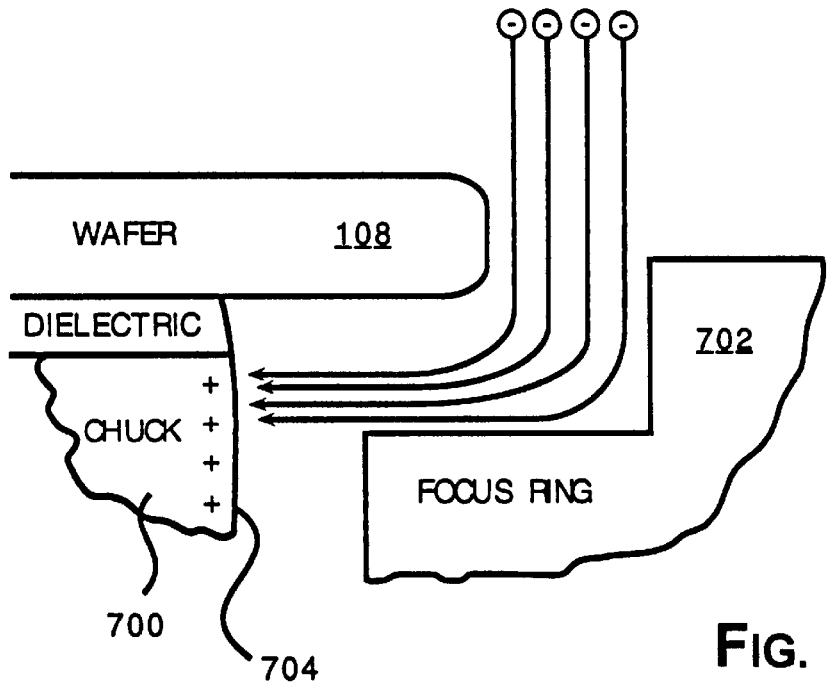
FIG. 7A illustrates a prior art bipolar electrostatic chuck, whose positively biased outer periphery contributes to the creation a large leakage current path.

Prior art bipolar electrostatic chucks, such as that shown in FIG. 7A, also have their outer periphery positively biased. When positively biased, the outer periphery of bipolar electrostatic chuck 700 attracts negatively charged particles such as electrons within the plasma processing chamber. The electrons follow the field lines between wafer 108 and wafer focus ring 702 toward surface 704 of the bipolar electrostatic chuck 700. Consequently, a current path is created through the plasma, allowing current from chuck 700 to leak to ground.

Figure 7B:
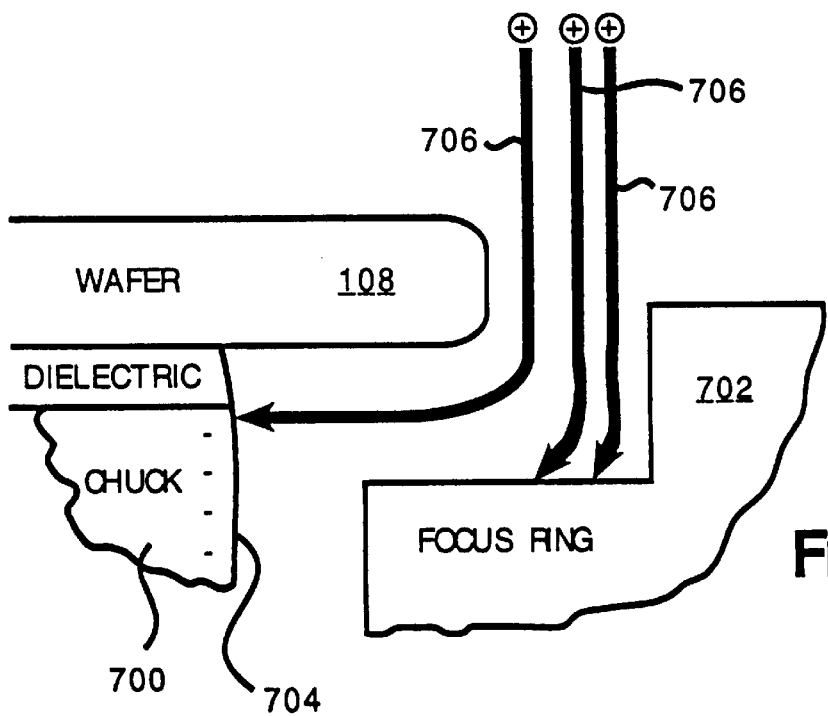
FIG. 7B illustrates, in accordance with another aspect of the present invention, a bipolar electrostatic chuck having its outer periphery positively biased to minimize leakage current.

The present invention disposes the bipolar electrostatic chuck's negative pole at the outer periphery of the chuck. In FIG. 7B, the outer periphery of bipolar electrostatic chuck 700 is negatively biased. If a torroid-and-base configuration is used, as that shown in FIGS. 5A–5B, the outer and negatively biased chuck periphery corresponds to base 504 while torroid 500, being set within the base, represents the positive pole.

As expected, electrons from the plasma processing chamber is repelled from the surface 704, which is negatively biased in FIG. 7B relative to the common reference voltage level. Although positively charged ions are attracted surface 704, as shown by lines 706, those positively charged ions are typically heavier and less mobile than electrons. Consequently, fewer of the heavier, positively charged ions will be able to follow the field lines between focus ring 702 and wafer 108 to come into contact with bipolar electrostatic chuck 700. Since there are fewer positively charged ions forming the current path, less current is drained from bipolar electrostatic chuck 700 through the plasma to ground.

Note that the leakage current can be controlled by appropriately modifying the current path. By taking into account the mass of the positively charged ions and their energy levels, the shape of focus ring 702 and chuck 700 may be appropriately modified to minimize the number of positively charged ions that can follow the field lines to come into contact with the chuck. When both the negative and positive poles of the bipolar chuck of FIG. 7B are negatively offset relative to the common reference potential, both minimum current leakage and improved clamping power are advantageously achieved.

Although the torroid-and-base configuration is used to discuss this aspect of the invention, it is contemplated that any bipolar chuck configuration may be employed as long as its outer periphery is negatively biased, i.e., constitutes the negative pole. This being the only limitation, the number of bipolar chuck designs that can take advantage of the present invention is almost unlimited.

Figure 8:
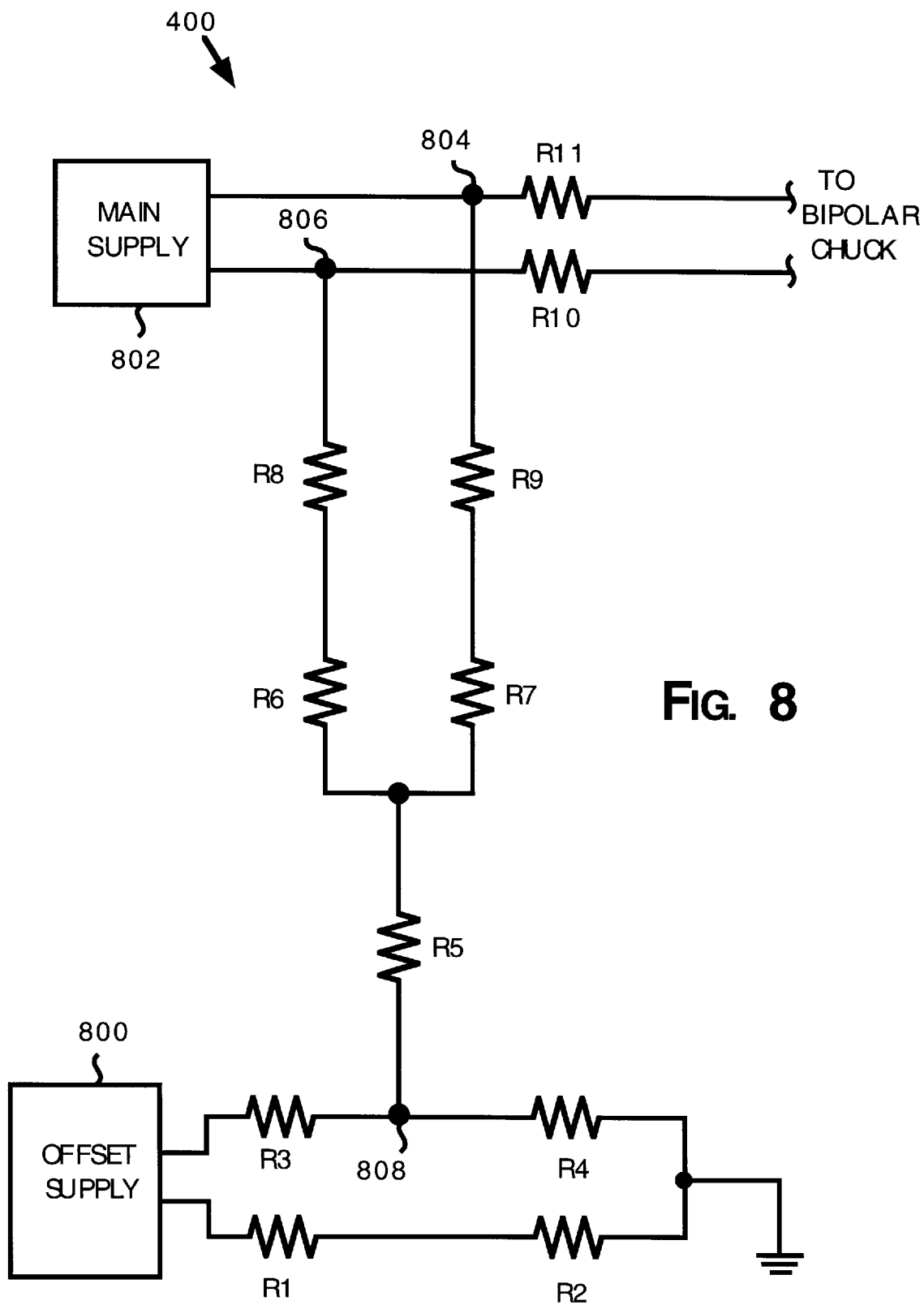
FIG. 8 illustrates an example of a negative offset power supply for generating the required potential levels for the positive and negative poles of the negative-offset bipolar electrostatic chuck.

FIG. 8 illustrates an example of bipolar power supply 400 for generating potential levels that are negatively offset from the common reference voltage level for the positive and negative poles. In the example of FIG. 8, bipolar power supply 400 includes two power supplies: a main supply 802 and an offset supply 800. Main supply 802 generates a positive potential level on a node 804 and a negative potential level on a node 806 that are equal in magnitude relative to an offset node 808.

The potential level at offset node 808 is set by offset supply 800 through a voltage divider network comprising resistors R1, R2, R3, and R4. The values of the resistors R1–R4 are selected such that a negative voltage reference, preferably one approximating that of the wafer bias during plasma processing, is present at offset node 808.

Resistors R5–R9 represent a symmetrical resistor network through which the potential levels at nodes 804 and 806 may be symmetrically referenced with respect to offset node 808. Through this symmetrical resistor network, the potential levels output by main supply 802 is negatively offset with respect to the common reference voltage level by the offset potential level that is present at offset node 808.

By way of example, suppose offset supply and the resistor network comprising R1–R4 bias offset node 808 at −100 V. If main supply 802 outputs +350V and −350V (relative to offset node 808) on nodes 804 and 806 respectively, the actual potential at nodes 804 and 806 relative to the common reference voltage level will be +250V and −450V respectively. However, when the wafer is biased at, say −100V, the potential difference between the wafer and the positive and negative poles will be +350V and −350 V respectively. As mentioned before, since these potential differences are equal in magnitude, they produce symmetrical electrostatic forces over the two poles, thereby improving wafer-to-chuck contact and reducing helium leakage.

It is contemplated that other methods of generating the negative offset potentials for the positive and negative poles may also be employed. In one embodiment, two different power supplies, one of which generates the positive pole potential, e.g., 250 V relative to the common reference voltage level, and the other generating the negative pole potential, e.g., −450 V relative to the common reference voltage level, may be employed (the above values are furnished for illustrative purposes only and do not represent a requirement). In another embodiment, offset node 808 is tied to the common reference voltage level. In this embodiment, neither offset supply 800 nor the resistor network comprising resistors R1–R4 is required. The values of resistors R5–R9 are selected such that an asymmetrical resistor network is created. Via this asymmetrical resistor network, the required negative offset potential levels for the positive and negative poles may be generated using only the main supply 802. As is apparent to those skilled in the art given this disclosure, conventional methods of generating the required potential levels for these poles may also be employed.

Figure 9:
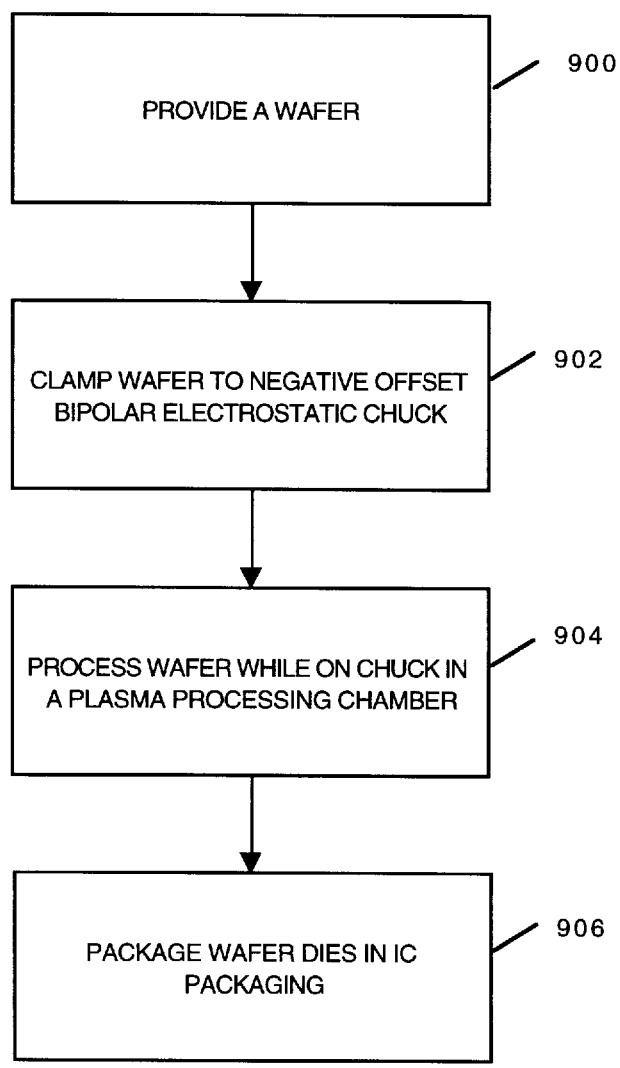
FIG. 9 illustrates the steps taken to fabricate an IC from wafer dies that are processed on the negative-offset bipolar electrostatic chuck of the present invention.

The negative offset bipolar electrostatic chuck may be used in any IC process that employs plasma in a plasma processing chamber. In accordance with one embodiment of the present invention, FIG. 9 illustrates the steps taken to fabricate an IC from wafer dies that are processed on the negative offset bipolar electrostatic chuck of the present invention. In block 900, a wafer is provided. In block 902, the wafer is clamped on the negative offset bipolar chuck of the present invention. In this block, the negative offset voltage is preferably, but not necessarily, lower or equal in magnitude than the expected wafer bias voltage during plasma processing. Preferably, the bipolar chuck of block 902 has its outer periphery negatively biased to repel negatively charged particles during plasma processing.

In block 904, the wafer is processed in a plasma processing chamber while being disposed on the negative offset bipolar chuck of the present invention. In block 906, the wafer goes through post processing steps. Its dies are then cut and packaged into integrated circuit chips in various conventional packaging forms for use in a variety of electronic devices such as consumer electronics, industrial electronics, or computing devices.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A bipolar electrostatic chuck system having a bipolar electrostatic chuck for securely holding a wafer on a surface of said bipolar electrostatic chuck, comprising;

a negative-offset power supply, including
an offset node,
a main supply for providing positive potential level and a negative potential level at its outputs, said positive potential level and said negative potential level being symmetrically biased relative to a voltage at said offset node,
an asymmetrical resistor network coupled to said offset nodes, and
an offset supply coupled to said asymmetrical resistor network for biasing said voltage at said offset node below a common reference voltage level wherein said positive potential level is positively biased relative to said common reference voltage level by a first magnitude, said negative potential level is negatively biased relative to said common reference voltage level by a second magnitude larger than said first magnitude;
a positive pole coupled to said negative-offset power supply for biasing said positive pole at said positive potential level when said negative-offset power supply is turned on; and
a negative pole coupled to said negative-offset power supply for biasing said negative pole at said negative potential level when said negative-offset power supply is turned on.

2. The bipolar electrostatic chuck system of claim 1 wherein said positive pole being one of a torroid and a base in a torroid-and-base chuck configuration, said negative pole being the other one of said torroid and said base in said torroid-and-base chuck configuration.

3. The bipolar electrostatic chuck system of claim 1 wherein said negative pole is disposed at the outer periphery of said chuck for repelling negatively charged particles in said plasma processing chamber from said chuck when said negative pole when negatively biased by said negative-offset power supply.

4. In a plasma processing chamber having a bipolar electrostatic chuck, said bipolar electrostatic chuck having a first pole, a second pole, and a dielectric layer disposed on both of said first and second poles, a method for securely holding a wafer on a surface of said dielectric layer, comprising:

providing a negative offset power supply including
providing a main power supply, and
providing an asymmetrical resistor network coupled to said main power supply and a common reference voltage node having a common reference voltage potential, said asymmetrical resistor network is configured to asymmetrically bias outputs of said main power supply relative to said common reference voltage level to generate a positive potential level and a negative potential level;
providing said positive potential level to said first pole of said bipolar electrostatic chuck, said positive potential level being positively biased relative to said common reference voltage level by a first magnitude; and
providing said negative potential level to said second pole of said bipolar electrostatic chuck, said negative potential level being negatively biased relative to said common reference voltage level by a second magnitude larger than said first magnitude.

5. The method of claim 4 wherein said second magnitude differs from said first magnitude by approximately the magnitude of the bias voltage of said wafer during plasma processing.

6. The method of claim 4 wherein said positive pole being one of a torroid and a base in a torroid-and-base chuck configuration, said negative pole being the other one of said torroid and said base in said torroid-and-base chuck configuration.

7. The method of claim 6 wherein said negative pole is disposed at the outer periphery of said chuck for repelling negatively charged particles in said plasma processing chamber from said chuck when said negative pole when negatively biased at said negative potential level.

8. A method for manufacturing integrated circuits in a plasma processing chamber having a negative-offset bipolar electrostatic chuck, said negative-offset bipolar electrostatic chuck having a first pole, a second pole, and a dielectric layer disposed on both of said first and second poles, comprising:

providing a main power supply;
providing an asymmetrical resistor network coupled to said main power supply and a common reference voltage node having a common reference voltage potential, said asymmetrical resistor network is configured to asymmetrically bias outputs of said main power supply relative to said common reference voltage level to generate a positive potential level and a negative potential level;
providing a semiconductor wafer;
clamping said wafer to said negative-offset bipolar electrostatic chuck, said first pole being biased at said positive potential level that is positively biased from a common reference voltage level of said plasma processing chamber by a first magnitude, said second pole being biased at said negative potential level that is negatively biased from said common reference voltage level by a second magnitude larger than said first magnitude; and
processing said wafer in said plasma processing chamber while said wafer is clamped on said chuck.

9. The method of claim 8 wherein said second magnitude differs from said first magnitude by approximately the magnitude of the bias voltage level of said wafer during said processing step.

10. The method of claim 8 wherein said positive pole being one of a torroid and a base in a torroid-and-base chuck configuration, said negative pole being the other one of said torroid and said base in said torroid-and-base chuck configuration.

11. The method of claim 10 wherein said negative pole is disposed at the outer periphery of said chuck for repelling negatively charged particles in said plasma processing chamber from said chuck when said negative pole when negatively biased at said negative potential level.

* * * * *